(12) United States Patent
Hill et al.

(10) Patent No.: US 7,847,353 B2
(45) Date of Patent: Dec. 7, 2010

(54) MULTI-THICKNESS SEMICONDUCTOR WITH FULLY DEPLETED DEVICES AND PHOTONIC INTEGRATION

(75) Inventors: Craig M. Hill, Warrenton, VA (US); Andrew T. Pomerene, Leesburg, VA (US); Daniel N. Carothers, Oro Valley, AZ (US); Timothy J. Conway, Gainesville, VA (US); Vu A. Vu, Falls Church, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 33 days.

(21) Appl. No.: 12/328,853

(22) Filed: Dec. 5, 2008

(65) Prior Publication Data

US 2010/0140708 A1    Jun. 10, 2010

(51) Int. Cl.
*H01L 27/12* (2006.01)
(52) U.S. Cl. .................. 257/348; 257/347; 257/350; 257/351; 257/E27.112
(58) Field of Classification Search ................ 257/347, 257/348, 350, 351, E27.112
See application file for complete search history.

(56) References Cited

U.S. PATENT DOCUMENTS

| | | |
|---|---|---|
| 4,420,258 A | 12/1983 | Burns et al. |
| 4,547,072 A | 10/1985 | Yoshida et al. |
| 4,748,617 A | 5/1988 | Drewlo |
| 4,921,354 A | 5/1990 | SooHoo |
| 5,165,001 A | 11/1992 | Takagi et al. |
| 5,281,805 A | 1/1994 | Sauer |
| 5,371,591 A | 12/1994 | Martin et al. |
| 5,430,755 A | 7/1995 | Perlmutter |

(Continued)

FOREIGN PATENT DOCUMENTS

EP    0818693 A1    1/1998

(Continued)

OTHER PUBLICATIONS

PCT International Search Report from related application PCT/US09/55213 mailed Oct. 13, 2009.

(Continued)

*Primary Examiner*—Victor A Mandala
(74) *Attorney, Agent, or Firm*—Finch & Maloney PLLC; Neil F. Maloney

(57) ABSTRACT

Techniques are disclosed that facilitate fabrication of semiconductors including structures and devices of varying thickness. One embodiment provides a method for semiconductor device fabrication that includes thinning a region of a semiconductor wafer upon which the device is to be formed thereby defining a thin region and a thick region of the wafer. The method continues with forming on the thick region one or more photonic devices and/or partially depleted electronic devices, and forming on the thin region one or more fully depleted electronic devices. Another embodiment provides a semiconductor device that includes a semiconductor wafer defining a thin region and a thick region. The device further includes one or more photonic devices and/or partially depleted electronic devices formed on the thick region, and one or more fully depleted electronic devices formed on the thin region. An isolation area can be formed between the thin region and the thick region.

21 Claims, 16 Drawing Sheets

U.S. PATENT DOCUMENTS

| | | | |
|---|---|---|---|
| 5,625,636 | A | 4/1997 | Bryan et al. |
| 5,674,778 | A | 10/1997 | Lee et al. |
| 5,703,989 | A | 12/1997 | Khan et al. |
| 5,736,461 | A | 4/1998 | Berti et al. |
| 5,828,476 | A | 10/1998 | Bonebright et al. |
| 5,834,800 | A | 11/1998 | Jalali-Farahani et al. |
| 6,117,771 | A | 9/2000 | Murphy et al. |
| 6,242,324 | B1 | 6/2001 | Kub et al. |
| 6,306,722 | B1 | 10/2001 | Yang et al. |
| 6,331,445 | B1 | 12/2001 | Janz et al. |
| 6,387,720 | B1 | 5/2002 | Misheloff et al. |
| 6,400,996 | B1 | 6/2002 | Hoffberg et al. |
| 6,451,712 | B1 | 9/2002 | Dalton et al. |
| 6,477,285 | B1 | 11/2002 | Shanley |
| 6,605,809 | B1 | 8/2003 | Engels et al. |
| 6,677,655 | B2 | 1/2004 | Fitzergald |
| 6,680,495 | B2 | 1/2004 | Fitzergald |
| 6,709,976 | B1 | 3/2004 | Kamin et al. |
| 6,725,119 | B1 | 4/2004 | Wake |
| 6,738,546 | B2 | 5/2004 | Deliwala |
| 6,785,447 | B2 | 8/2004 | Yoshimura et al. |
| 6,795,622 | B2 | 9/2004 | Forrest et al. |
| 6,850,252 | B1 | 2/2005 | Hoffberg |
| 6,861,369 | B2 | 3/2005 | Park |
| 6,936,839 | B2 | 8/2005 | Taylor |
| 6,968,110 | B2 | 11/2005 | Patel et al. |
| 7,006,881 | B1 | 2/2006 | Hoffberg et al. |
| 7,010,208 | B1 | 3/2006 | Gunn, III et al. |
| 7,016,587 | B2 | 3/2006 | Kubby et al. |
| 7,043,106 | B2 | 5/2006 | West et al. |
| 7,072,556 | B1 | 7/2006 | Gunn, III et al. |
| 7,082,247 | B1 | 7/2006 | Gunn, III et al. |
| 7,103,252 | B2 | 9/2006 | Ide |
| 7,139,448 | B2 | 11/2006 | Jain et al. |
| 7,169,654 | B2 | 1/2007 | Zia et al. |
| 7,215,845 | B1 | 5/2007 | Chan et al. |
| 7,218,809 | B2 | 5/2007 | Zhou et al. |
| 7,218,826 | B1 | 5/2007 | Gunn, III et al. |
| 7,259,031 | B1 | 8/2007 | Dickinson et al. |
| 7,272,279 | B2 | 9/2007 | Ishikawa et al. |
| 7,315,679 | B2 | 1/2008 | Hochberg et al. |
| 7,333,679 | B2 | 2/2008 | Takahashi |
| 7,348,230 | B2 | 3/2008 | Matsuo et al. |
| 7,356,221 | B2 | 4/2008 | Chu et al. |
| 7,410,841 | B2 * | 8/2008 | Tigelaar ............... 438/153 |
| 7,447,395 | B2 | 11/2008 | Montgomery et al. |
| 2003/0020144 | A1 | 1/2003 | Warble et al. |
| 2003/0026546 | A1 | 2/2003 | Deliwala |
| 2003/0183825 | A1 | 10/2003 | Morse |
| 2004/0146431 | A1 | 7/2004 | Scherer et al. |
| 2004/0190274 | A1 | 9/2004 | Saito et al. |
| 2004/0207016 | A1 * | 10/2004 | Patel et al. .............. 257/347 |
| 2004/0258348 | A1 | 12/2004 | Deliwala |
| 2005/0094938 | A1 | 5/2005 | Ghiron et al. |
| 2005/0236619 | A1 * | 10/2005 | Patel et al. ................ 257/57 |
| 2006/0105509 | A1 | 5/2006 | Zia et al. |
| 2006/0158723 | A1 | 7/2006 | Voigt et al. |
| 2006/0238866 | A1 | 10/2006 | Von Lerber |
| 2006/0240667 | A1 | 10/2006 | Matsuda et al. |
| 2007/0116398 | A1 | 5/2007 | Pan et al. |
| 2007/0202254 | A1 | 8/2007 | Ganguli et al. |
| 2007/0257314 | A1 | 11/2007 | Joshi et al. |
| 2008/0122024 | A1 | 5/2008 | Kato |
| 2008/0159751 | A1 | 7/2008 | Matsui et al. |
| 2008/0240180 | A1 | 10/2008 | Matsui et al. |
| 2008/0265325 | A1 | 10/2008 | Tigelaar |

FOREIGN PATENT DOCUMENTS

| | | |
|---|---|---|
| EP | 1 067 409 | 1/2001 |
| WO | 9314514 | 7/1993 |
| WO | 0127669 | 4/2001 |
| WO | 0216986 | 2/2002 |
| WO | 2004088724 | 10/2004 |
| WO | 2007/149055 A1 | 12/2007 |

OTHER PUBLICATIONS

PCT Written Opinion from related application PCT/US09/55213 mailed Oct. 13, 2009.

Soltani et al., "Ultra-high Q planar silicon microdisk resonators for chip-scale silicon photonics", Apr. 16, 2007, vol. 15, No. 8, Optics Express.

Pruessner et al., "InP-Based Optical Waveguide MEMS Switches with Evanescent Coupling Mechanism", Journal of Microelectromechanical Systems, vol. 14, No. 5, Oct. 2005.

May et al., "Integrated Process for Silicon Nitride Waveguide Fabrication", IBM Technical Disclosure Bulletin, vol. 33, No. 2, Jul. 1990.

Matsushita et al., "Narrow CoSi2 Line Formation on SiO2 by Focused Ion Beam", IEEE Xplore 1999.

"Process Integration", Cobalt Self-aligned Silicide Process, Chapter 13.

Liu et al., "Design of Monolithically Integrated GeSi Electro-absorption Modulators and Photodetectors on an SOI Plaform", Optics Express 623, vol. 15, No. 2, Jan. 22, 2007.

Fijol et al., "Fabrication of Silicon-on-insulator Adiabatic Tapers for Low Loss Optical Interconnection of Photonic Devices".

Yap et al., "Integrated Opteoelectronic Circuits with InP-based HBTs", Proceedings of SPIE, vol. 4290, 2001.

Roth, "Electroabsorption Modulators for CMOS Compatible Optical Interconnects in III-V and Group IV Materials", Aug. 2007, (part 1 of 3).

Roth, "Electroabsorption Modulators for CMOS Compatible Optical Interconnects in III-V and Group IV Materials", Aug. 2007, (part 2 of 3).

Roth, "Electroabsorption Modulators for CMOS Compatible Optical Interconnects in III-V and Group IV Materials", Aug. 2007, (part 3 of 3).

Kimberling et al., "Electronic-photonic Integrated Circuits on the CMOS Platform".

Chao et al., "Analysis of Temperature Profiles of Thermo-optic Waveguides", Fiber and Integrated Optics, vol. 33.

Okyay et al., "Silicon Germanium CMOS Optoelectronic Switching Device: Bringing Light to Latch", IEEE Transactions on Electron Devices, vol. 54, No. 12, Dec. 2007.

McAulay et al., "All-optical Switching and Logic with an Integrated Optic Microring Resonator", Proc. of SPIE vol. 5814.

Kimmet, "Chapter 6. Integrated Circuit Fabrication Details", 1999, 18 pages.

Office Action dated Jun. 2, 2009 from related matter U.S. Appl. No. 12/201,943 (11 pages).

"Erbium Doped Optical Waveguide Amplifiers on Silicon", P.G. KiK and A. Polman, MRS Bulletin 23(4), 48, Apr. 1998, 7 pages.

International Search Report and Written Opinion dated Mar. 4, 2010 issued in PCT Application No. PCT/US09/66734, 10 pages.

\* cited by examiner

MULTI-THICKNESS SEMICONDUCTOR WITH FULLY DEPLETED DEVICES AND PHOTONIC INTEGRATION

RELATED APPLICATIONS

This application is related to U.S. application Ser. No. 12/201,807, filed Aug. 29, 2008, and titled "Two-Step Hardmask Fabrication Methodology for Silicon Waveguides" which is herein incorporated by reference in its entirety.

FIELD OF THE INVENTION

The invention relates to semiconductors, and more particularly, to a methodology for fabricating semiconductors including structures and devices of varying thickness.

BACKGROUND OF THE INVENTION

There are number of waveguide structures that can be used to realize an optical waveguide in silicon, such as ridge and channel waveguides. In such structures, light is typically guided in a high refractive index material (typically referred to as the waveguide core) that is surrounded by a lower index material (typically referred to as the waveguide cladding).

A channel waveguide is usually formed by depositing a high refractive index core material on a low refractive index bottom cladding material. Excess of the high refractive index material to either side of the channel is removed down to the underlying oxide using standard lithography processing (i.e., mask and etch). Once the channel is formed, a low refractive index upper cladding is deposited around the channel. The mismatch in refractive index between the core and the cladding effectively operates to contain radiation within the channel of the waveguide.

A ridge waveguide is a variation on the channel waveguide, wherein the high refractive index core material is only partially etched back to the underlying oxide, leaving a so-called slab to either side of the ridge. This lowers the in-plane refractive index contrast, which generally decreases scattering loss. In some applications, both ridge and channel type waveguide structures are used.

Currently, semiconductors including both CMOS circuitry and silicon waveguides are fabricated so that the CMOS circuitry and waveguides essentially have the same silicon thickness. Such conventional techniques are associated with a number of disadvantages, including that they do not allow for fully depleted SOI devices. Nor do they allow for the ability to modify waveguide thickness independently of the CMOS devices.

What is needed, therefore, are techniques that facilitate the fabrication of silicon-based circuitry including CMOS and waveguide structures. In a more general sense, there is a need for more efficient techniques for fabricating semiconductors including structures and devices of varying thickness.

SUMMARY OF THE INVENTION

One embodiment of the present invention provides a semiconductor device. The device includes a semiconductor wafer defining a thin region and a thick region. The device further includes one or more photonic devices and/or partially depleted electronic devices formed on the thick region, and one or more fully depleted electronic devices formed on the thin region. The device may further include an isolation area formed between the thin region and the thick region. The wafer may be, for example, a silicon-on-insulator (SOI) wafer having epitaxial silicon on a thick buried oxide. The partially depleted electronic devices may be, for example, partially depleted CMOS devices, and photonic devices may be, for example, waveguides and/or ring modulators. Note, however, that any number or combination of thin region devices and thick region devices can be used.

Another embodiment of the present invention is a method for fabricating a semiconductor device. The method includes thinning a region of a semiconductor wafer upon which the device is to be formed, thereby defining a thin region and a thick region of the wafer. The method continues with forming on the thick region one or more photonic devices and/or partially depleted electronic devices, and forming on the thin region one or more fully depleted electronic devices. The method may further include forming an isolation area between the thin region and the thick region. The wafer may be, for example, a silicon-on-insulator (SOI) wafer having epitaxial silicon on a thick buried oxide. In some cases, thinning a region of a semiconductor wafer includes the use of thermal oxidation. The method may include the preliminary steps of depositing onto the wafer a two-layer hardmask including a bottom layer of oxide and a top layer of nitride, and then depositing resist over the thick region, thereby leaving the two-layer mask over the thin region exposed. Here, the method further includes etching the wafer to remove the exposed two-layer hardmask over the thin region. In one such specific example case, thinning a region of a semiconductor wafer includes implanting oxygen into an epitaxial silicon layer of the wafer, cleaning the wafer, and then annealing to convert the implanted oxygen regions into oxide. In another such specific example case, thinning a region of a semiconductor wafer includes partially dry etching an epitaxial silicon layer of the wafer, cleaning the wafer, and then carrying out a thermal oxidation process to consume damaged epitaxial silicon resulting from the partial dry etching. In another such specific example case, thinning a region of a semiconductor wafer includes cleaning the wafer, and carrying out a thermal oxidation growth process to consume underlying epitaxial silicon of the wafer. In any such cases, once the epitaxial silicon of the wafer is thinned, the method may further include stripping the two-layer hardmask (including any remaining resist on that two-layer hardmask). In some cases, forming on the thick region and forming on the thin region includes depositing onto the wafer a two-layer hardmask including a bottom layer of oxide and a top layer of nitride, selectively depositing resist on a hardmask area over the thick region (thereby providing an initial pattern for photonics and/or any electronics in the thick region), and selectively depositing resist on a hardmask area over the thin region (thereby providing a pattern for fully depleted electronics in the thin region). Here, forming on the thick region and forming on the thin region may further include performing an initial etch to remove unmasked portions of the hardmask nitride and epitaxial silicon of the wafer, and stripping the selectively deposited resist. In such cases, the initial etch associated with the thick region is partial in that a portion of unmasked epitaxial silicon remains after the initial etch, and the initial etch associated with the thin region is a full etch in that all unmasked epitaxial silicon in the thin region is removed thereby exposing a buried oxide layer of the wafer. In some such specific cases, forming on the thick region and forming on the thin region may further include selectively depositing resist over the thick region including the portion of unmasked epitaxial silicon remaining after the initial etch (thereby providing a pattern for a slab for photonics in the thick region), performing a remainder of the initial etch to remove unmasked portions of the remaining epitaxial silicon of the thick region, thereby defining a slab for photonics, and then stripping the resist deposited over the thick and thin regions. In one such specific case, forming on the thick region and forming on the thin region further include performing liner oxidation so that remaining epitaxial silicon is provided with an oxide layer. In another such specific case, forming on the thick region further includes carrying out a slab implant process. In another such specific case, forming on the thick region and forming on the thin region further include performing an oxide fill process to fill one or more shallow trench isolation regions, patterning an oxide thinning mask (thereby protecting the thick region and exposing the thin region), and then performing an oxide etch to remove a bulk of oxide above the thin region and any unprotected isolation region. Here, forming on the thick region and forming on the thin region may further include performing a chemical mechanical polish (CMP) process so as to polish all oxide down to the underlying top layer of nitride, and then removing remaining nitride. In one such case, forming on the thick region and forming on the thin region further include performing CMOS processing, such as sacrificial oxide growth, body implants, gate oxide growth, polysilicon gate deposition and patterning, dielectric spacer deposition and etch back, and/or source/drain implants.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1:
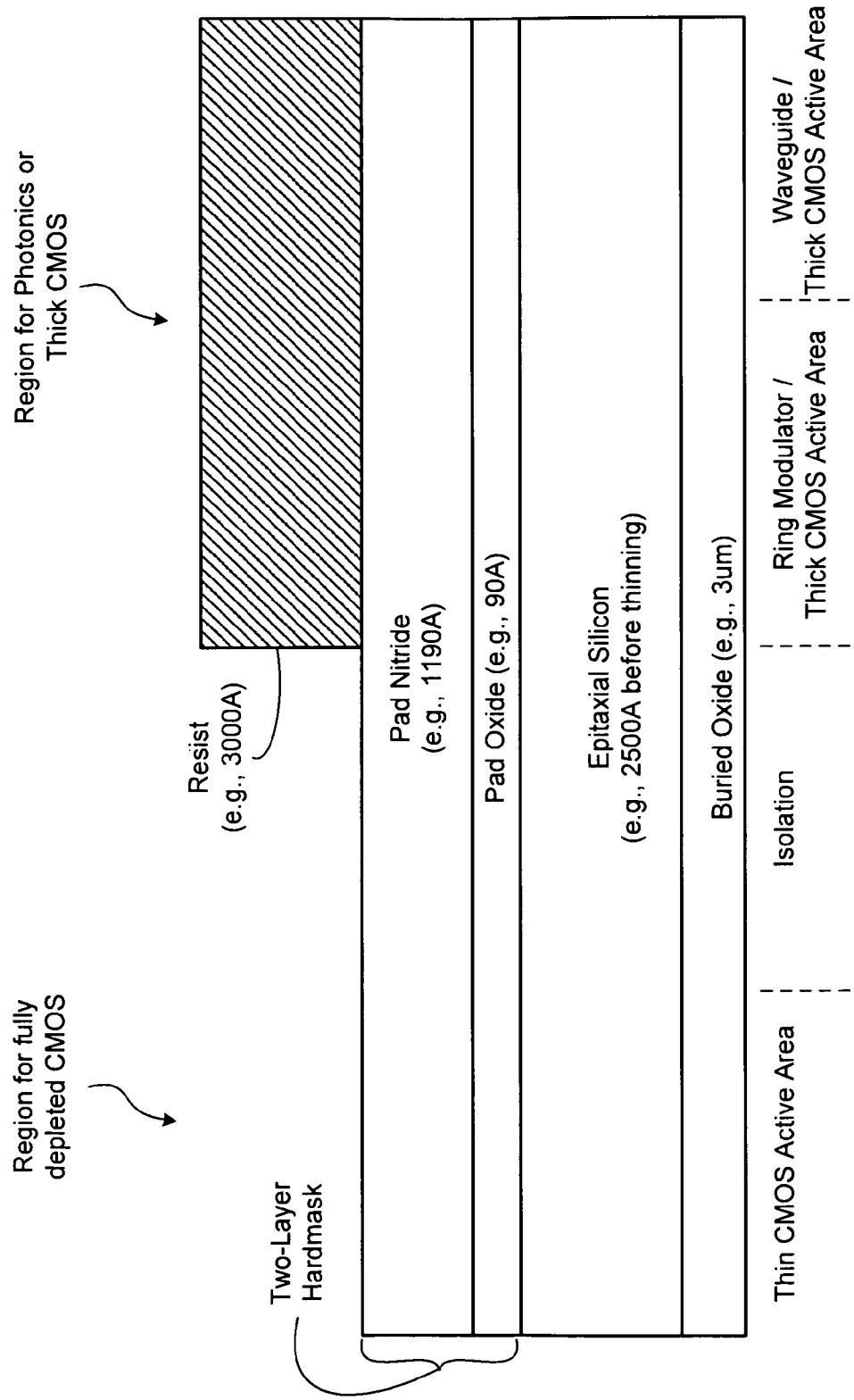
FIGS. 1-14 show a series of cross-sectional side-views that illustrate a method for fabricating a semiconductor having structures and devices of varying thickness, as well as the resulting semiconductor itself, in accordance with an embodiment of the present invention. Note that the figures are not drawn to scale; rather, they are drawn to facilitate explanation. Details such as layer thicknesses and actual section or feature locations will be apparent from the corresponding detailed description.

Techniques are disclosed that facilitate the fabrication of semiconductors including structures and devices of varying thickness. For instance, the techniques can be used to fabricate silicon circuitry that includes fully depleted silicon-on-insulator (SOI) devices (e.g., around 500 A Si thickness), photonic waveguides (e.g., around 2300 A Si thickness), and/or ring modulators (e.g., which may have slab thickness values around 500 to 800 A). Likewise, the techniques can be used to fabricate silicon-based circuitry that includes both channel and ridge waveguide structures. Semiconductor circuitry fabricated with materials other than silicon (e.g., gallium arsenide, indium phosphate, and quartz, sapphire) can equally benefit from the techniques, and numerous circuit configurations will be apparent in light of this disclosure. The techniques are not intended to be limited to particular semiconductor materials or specific types of circuitry/structures; rather, any semiconductor materials that can be configured with circuitry/structures of varying thickness may benefit.

General Overview

As previously explained, semiconductors including both CMOS circuitry and silicon waveguides are currently fabricated so that the CMOS circuitry and waveguides essentially have the same silicon thickness. Such conventional techniques are associated with a number of disadvantages, including that they do not allow for fully depleted SOI devices. Nor do they allow for the ability to modify waveguide thickness independently of the CMOS devices.

One embodiment of the present invention provides a method for fabricating SOI CMOS devices and silicon high index contrast (HIC) silicon waveguides and photonic devices on the same substrate, where at least one of the CMOS devices has a silicon thickness that is significantly thinner than the silicon thickness for the silicon waveguides. In some specific such embodiments, the method may be used for integration of fully depleted CMOS devices with silicon HIC waveguides having channel and ridge type configurations.

The method may employ a substrate having epitaxial silicon on buried oxide, although other suitable substrate materials and configurations can be used, as will be apparent in light of this disclosure. The method of this example embodiment generally includes thinning the silicon in the fully depleted CMOS region before beginning the patterning and formation of the silicon waveguides, and before creating isolation regions in the fully depleted CMOS regions. The silicon in the fully depleted CMOS region can be thinned, for instance, by completing pad oxidation, pad nitride deposition, photolithography to block (protect) the photonic regions, and patterning a nitride/oxide stack (also referred to as pad oxide and pad nitride layers, or collectively as a two-layer hardmask) to expose the silicon regions to be thinned.

Once the nitride/oxide stack is patterned as desired, one option is to implant oxygen into the silicon using the resist/nitride/oxide stack as a mask, and then strip the resist (note that resist can be stripped before or after implant process), wafer clean, and anneal to form oxide in the implanted regions. A second option is to dry etch the silicon to a desired depth, strip the resist (note that resist can be stripped before or after dry etch process), and complete a short oxidation to remove dry etch damage. A third option is to strip the resist, wafer clean, and then complete a thermal oxide growth to consume underlying silicon.

With any of these options, the next step of this example embodiment is to strip the nitride and oxide layers (or what remains thereof), which can be done, for example, using hot phosphoric acid and hydrofluoric acid, respectively. At this point, the waveguides can be formed while simultaneously patterning the thinned silicon region. One example process that can be used in forming waveguide structures including channel and ridge configurations is described in the previously incorporated U.S. application Ser. No. 12/201,807. Any waveguide slab regions may be implanted as needed. The trenches or spaces between silicon regions can then be filled, for example, with an oxide. In such cases, the resulting oxide layer is then planarized.

Note that the planarization is different than typically associated with standard CMOS processing, because of the extra oxide layer over the thinned silicon regions. At this point, a mask and dry etch can be used to thin the oxide over the thinned silicon regions, which reduces the polish load in the thinned silicon regions. The oxide can be planarized, for instance, using chemical mechanical polish (CMP) with the pad nitride as a polish stop. The nitride can be removed using hot phosphoric acid, and then the device is ready for integration into standard CMOS processing (e.g., sacrificial oxidation, body implants, and poly gate formation).

The silicon regions that are not thinned may be used, for example, for partially depleted CMOS devices (e.g., transistors) and/or photonic devices (e.g., modulators, ridge, and/or channel waveguides), thereby allowing for photonics devices to be integrated with fully depleted and partially depleted SOI on the same wafer. In addition, the method can be used to remove or bury residuals in transition regions between fully depleted CMOS and photonics regions. Thus, disclosed techniques provide both a semiconductor device that includes a wafer defining both a thin region and a thick region (thereby enabling a combination of diverse thickness circuitries/structures), as well as methodologies for making same.

Fabrication Methodology

FIGS. 1-14 show a series of cross-sectional side-views that illustrate a method for fabricating a semiconductor having structures and devices of varying thickness, in accordance with an embodiment of the present invention. In addition, the resulting semiconductor device according to one example embodiment is provided. Each of the figures will now be referred to in turn.

FIG. 1 shows a SOI wafer having epitaxial silicon on a thick buried oxide (or other suitable insulator material layer). A two-layer hardmask of oxide (pad oxide) and nitride (pad nitride) is deposited onto the SOI wafer. As can be further seen, the device being constructed has a number of sections, including a thin CMOS active area, an isolation area, a ring modulator or thick CMOS active area, and a waveguide or thick CMOS area. Resist is deposited over the device's region designated for photonics or thick CMOS, while the region designated for fully depleted CMOS is left unprotected to allow for thinning of the epitaxial silicon.

In other embodiments, a grown film of amorphous-silicon, polysilicon or nanosilicon can be used in place of the SOI wafer. In general, growing on the flattest possible surface, with the highest quality underlying oxide, is beneficial. In some embodiments, a high density plasma, chemical vapor deposited (HDP-CVD) silicon dioxide is employed for this purpose. The HDP-CVD approach provides a high degree of control over the uniformity of the oxide cladding. The underlying substrate below the insulator and silicon layers can be, for example, silicon, although other suitable substrate materials can be used, such as gallium arsenide, indium phosphate, and quartz, sapphire, depending on the materials being deposited and giving consideration to factors such as thermal coefficients of expansion.

In this example embodiment, the buried oxide is about 3 micrometers thick and can be, for example, silicon dioxide. The layer of epitaxial silicon is about 2500 angstroms thick, prior to any thinning. The pad oxide layer of the hardmask is about 90 angstroms and the nitride pad layer is about 1190 angstroms. In some embodiments, the pad oxide layer of the hardmask is the same material as the buried oxide (e.g., silicon dioxide). The resist deposited over the region for photonics or thick CMOS is about 3000 angstroms. These layer thicknesses are not intended to limit the present invention, and are only provided as an example embodiment. Numerous other configurations and layer thickness schemes will be apparent in light of this disclosure.

Deposition of the hardmask onto the epitaxial silicon in this example case involves the deposition of an oxide/nitride hardmask, wherein a bottom layer of oxide is deposited followed by a top layer of nitride. The two-layer hardmask allows integration within a CMP based process. In more detail, and in accordance with one particular embodiment, a top nitride layer acts as the hardmask and polish stop layer for CMP. The bottom oxide layer acts as a stop for a subsequent removal of the top nitride layer, thereby preserving circuit (e.g., CMOS and waveguide structures) qualities not only across the wafer, but from wafer to wafer.

Figure 2:
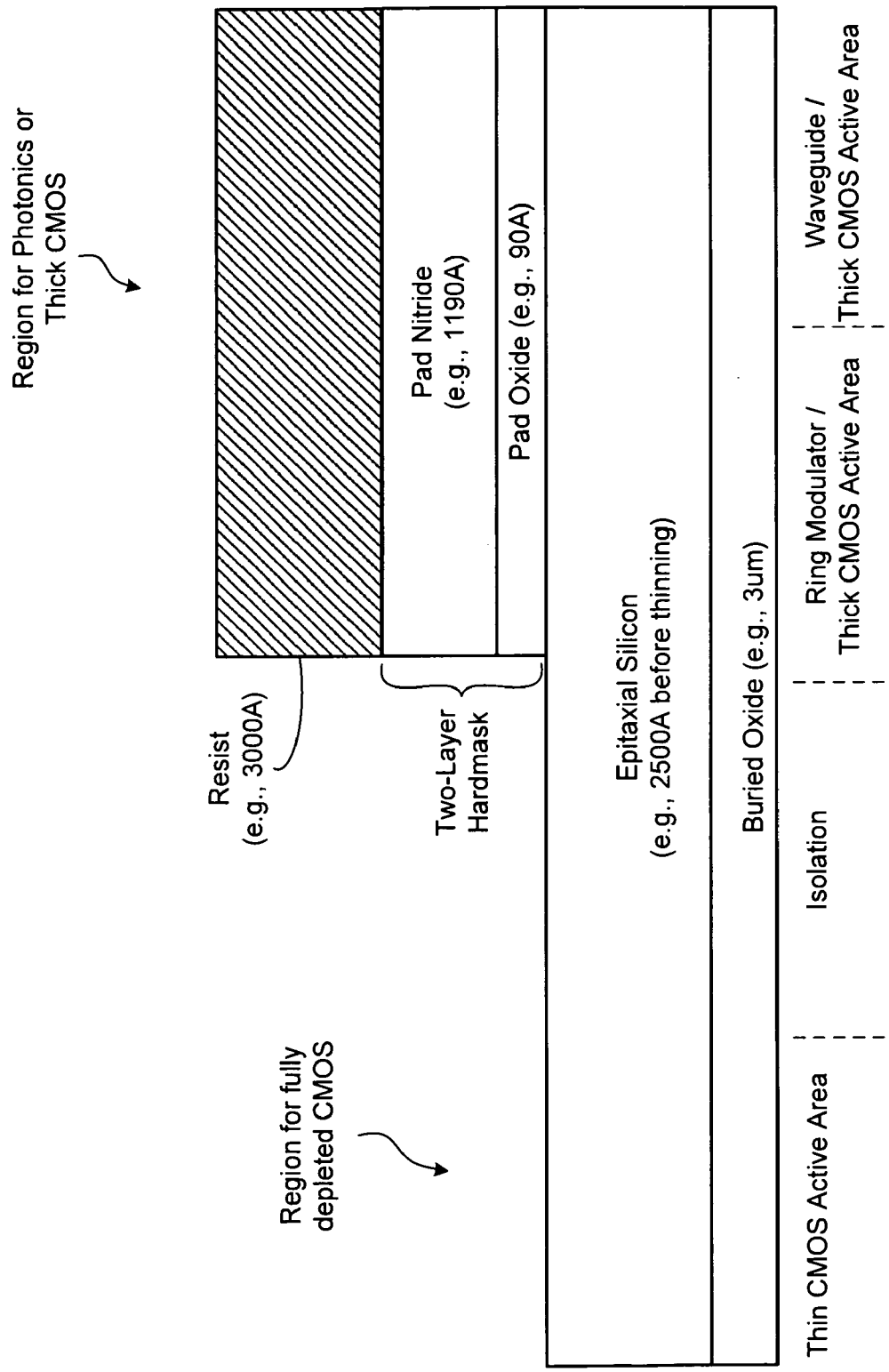

FIG. 2 shows patterning of the two-layer hardmask, where portions of the hardmask not covered by resist are removed. The hardmask patterning can be carried out, for example, using standard photolithography techniques, thereby protecting (with resist) the region for photonics/thick CMOS and exposing the region designated fully depleted CMOS (or other circuitry/structure that requires a thinned region). A dry etch can be used to remove the pad nitride and pad oxide in the exposed region.

Figure 3A:
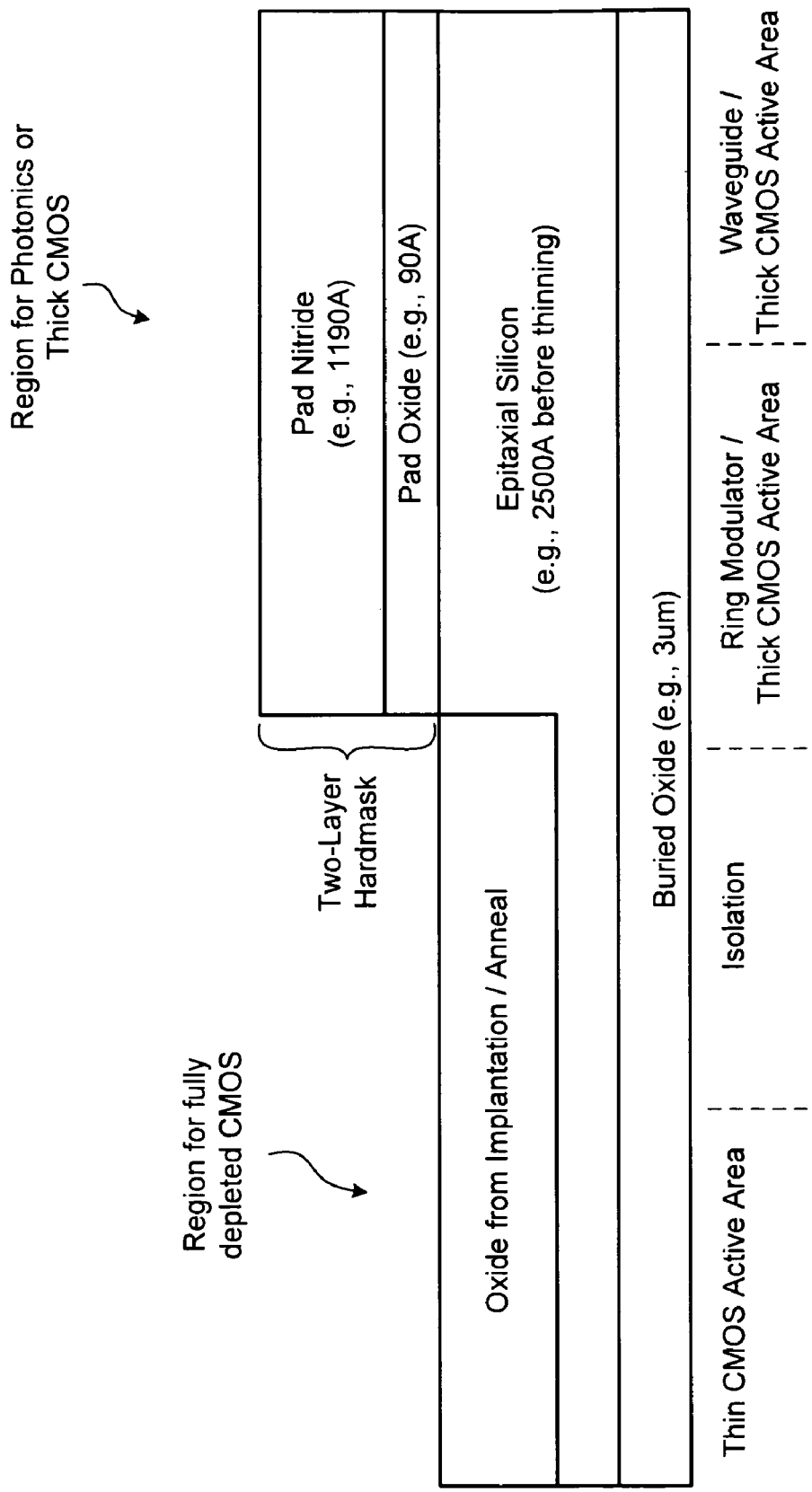
Figure 3B:
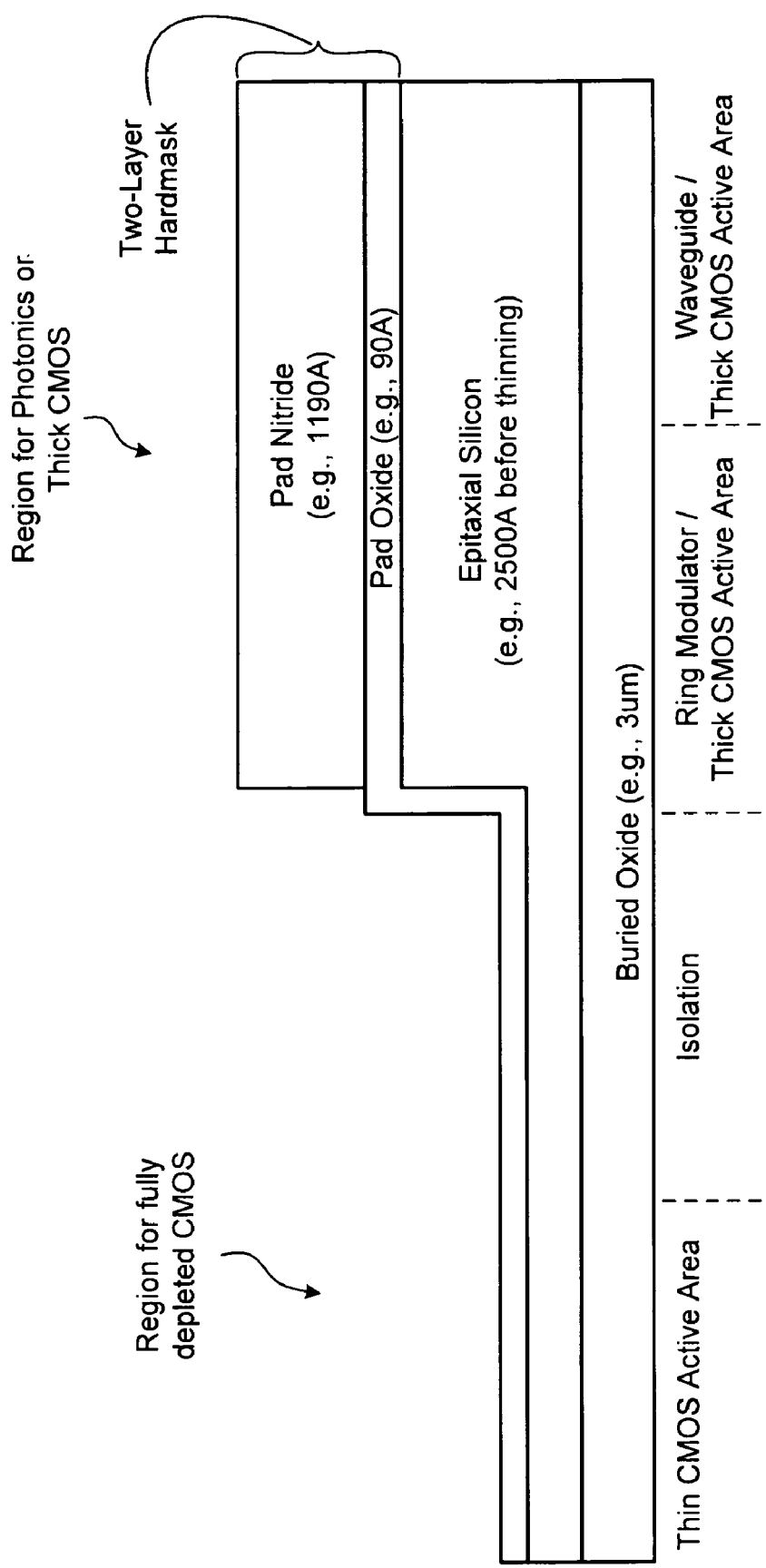
Figure 3C:
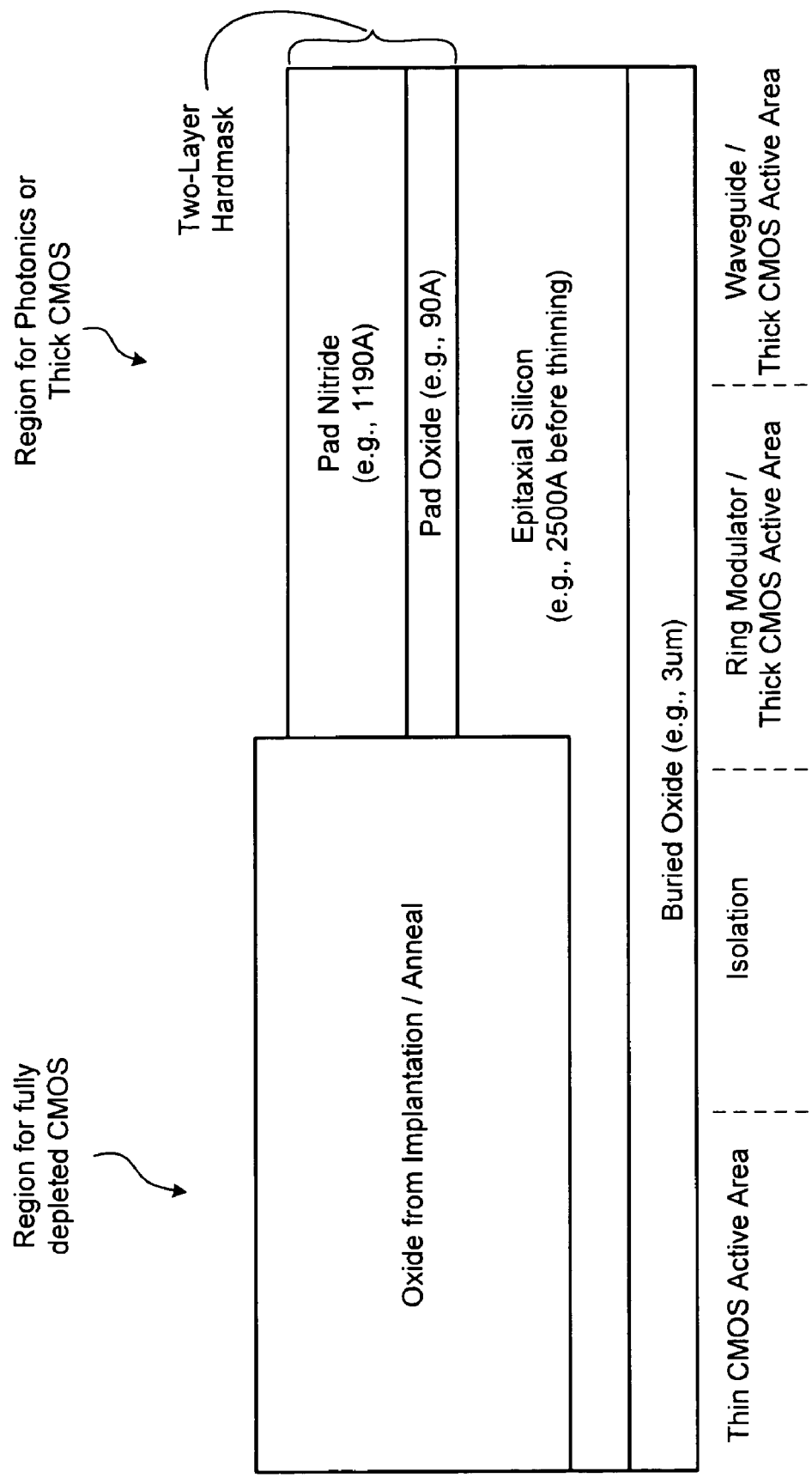

Thinning of the epitaxial silicon at the region for fully depleted CMOS can be carried out in a number of ways using thermal oxidation. FIGS. 3a, 3b, and 3c illustrate three example such techniques that can be used. The first option of FIG. 3a comprises implanting oxygen into the epitaxial silicon layer. In such a case, the resist (shown in FIG. 1), as well as the pad nitride and pad oxide of the two layer hardmask can be used as an implant mask, to protect the region for photonics and/or thick CMOS from the implantation process. The resist is then stripped, and a wafer clean is performed (e.g., Huang clean). Then, an annealing process is carried out to convert the implanted oxygen regions into oxide. Generally, the annealing is carried out at a temperature and duration sufficient to convert the implanted oxygen regions into silicon dioxide. The annealing can be carried out, for example, at a temperature in the range of about 600° C. to about 1,500° C. for a duration in the range of about 1 minute to about 8 hours. Variations on the implant mask will be apparent in light of this disclosure. For instance, in some embodiments, the resist used to pattern the hardmask can be removed, and only the two-layer hardmask is used as the implant mask (i.e., strip resist, implant oxygen, clean, and anneal). Furthermore, note that resist used for the implant mask can be the same as the resist used to pattern the hardmask. Alternatively, a separate resist can be used for each of the hardmask patterning and implant mask steps, if so desired.

The second option of FIG. 3b comprises partially dry etching the epitaxial silicon, stripping the resist, and then performing a wafer clean (e.g., Huang clean). A suitable variation here comprises stripping the resist, partially dry etching the epitaxial silicon (using the two layer oxide-nitride stack as a hardmask), and then performing a wafer clean (e.g., Huang clean). Then, a thermal oxidation process is carried out to consume the damaged epitaxial silicon (resulting from the dry etch process). This option requires a very uniform silicon etch rate across the wafer as well as from wafer to wafer. The third option of FIG. 3c comprises stripping the resist and performing a wafer clean (e.g., Huang clean). Then, a thermal oxidation growth process is carried out to consume the underlying epitaxial silicon. This option avoids the need for a uniform silicon etch rate across the wafer as well as from wafer to wafer.

Figure 4:
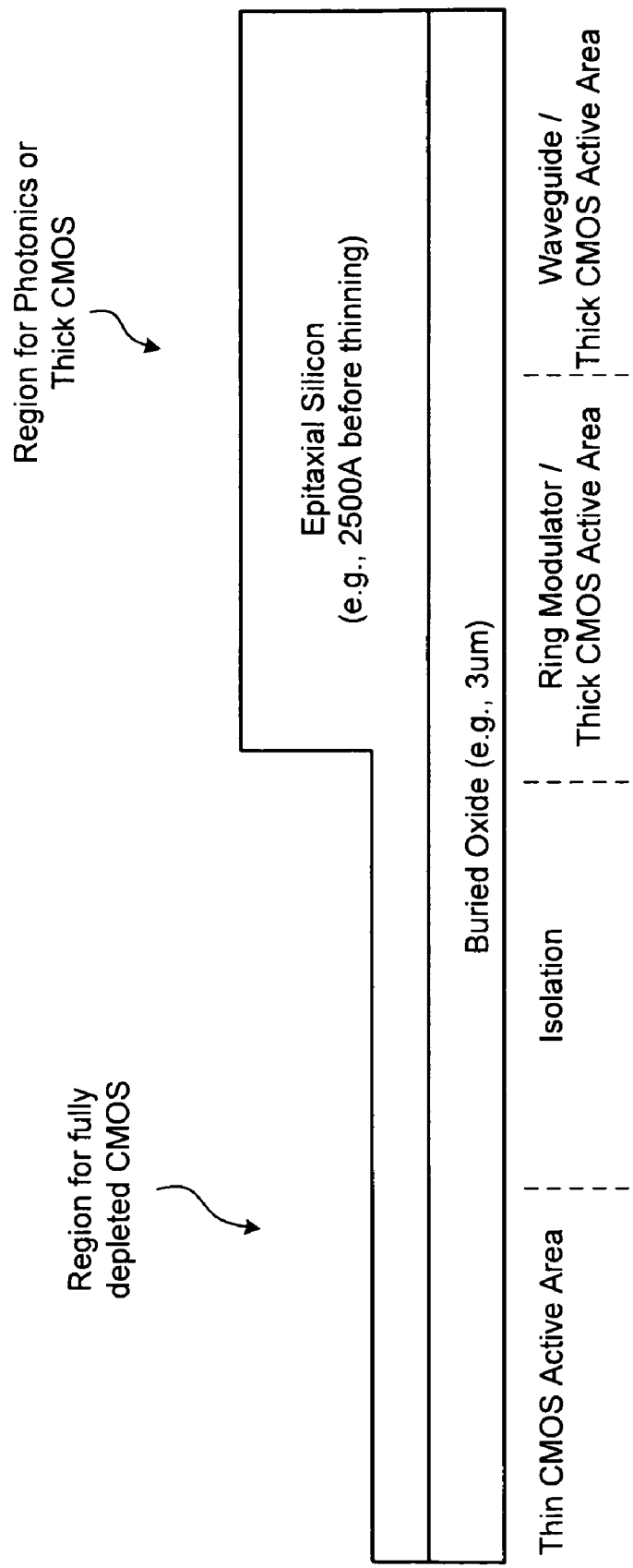

Once the epitaxial silicon is thinned in the region for the fully depleted CMOS, the method continues as shown in FIG. 4. Here, the pad nitride is stripped off (e.g., using a hot phosphoric dip). Similarly, all oxide can be removed (e.g., using a hydrofluoric acid). As can be seen, the resulting structure includes a thinned region of silicon for fully depleted CMOS, and a thicker region of silicon for photonics and/or partially depleted CMOS.

Figure 5:
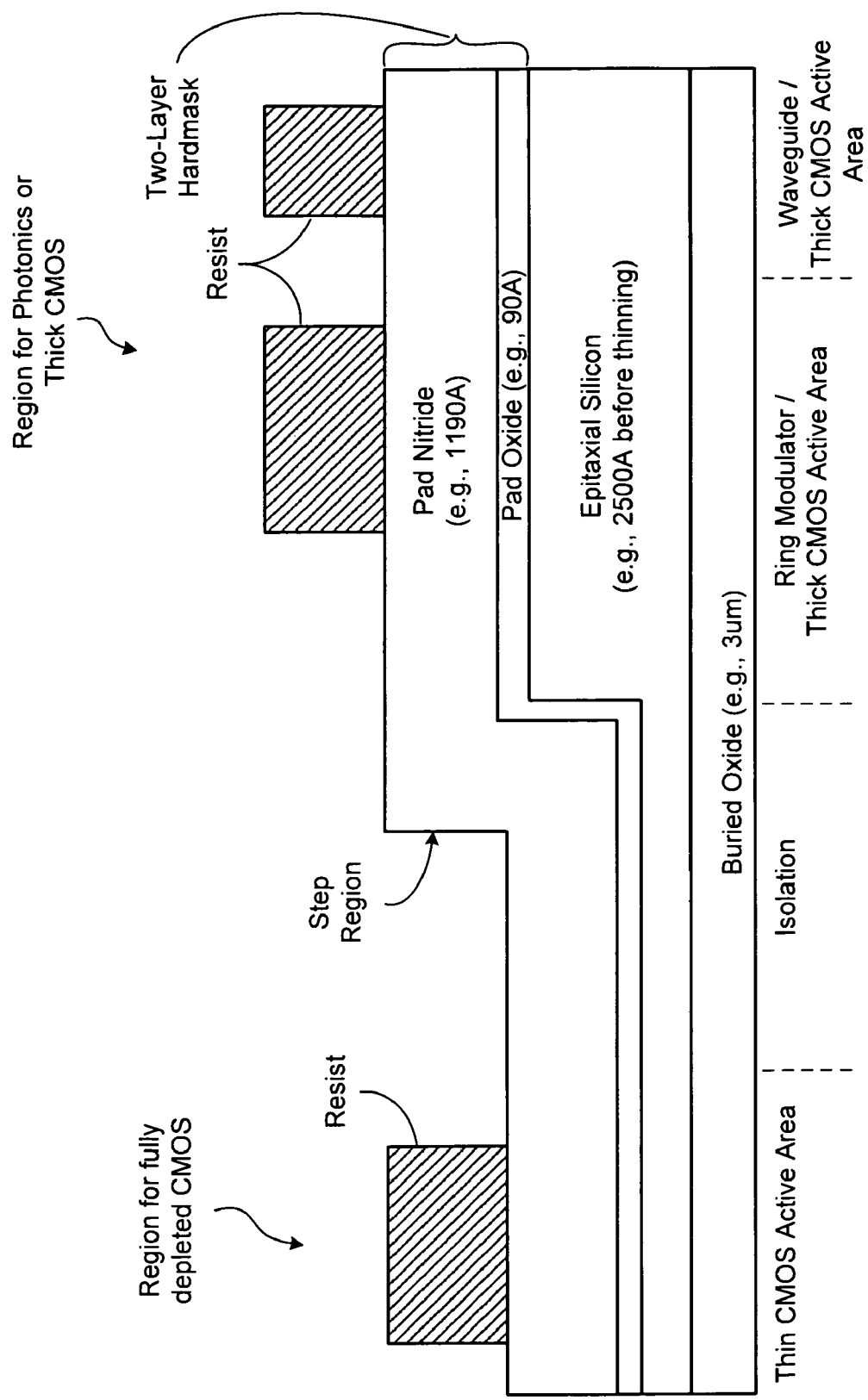

The method continues as shown in FIG. 5, wherein a new two-layer hardmask is deposited as explained before using pad oxidation (for lower oxide layer) and pad nitride deposition (for upper nitride layer). The thicknesses for each of the oxide and nitride layers as well as the specific materials themselves can be, for example, the same as the previous hardmask. The initial pattern for the waveguides and any active areas for thick CMOS region is then applied to the two-layer hardmask, where photoresist (resist) is applied to areas that are to be preserved. As is known, an "active area" is a semiconductor term which defines the areas where electronic components (e.g., MOSFETs or other such gate-level components and modulators, salicide structures, etc) will be located. This standard electronics layer is combined into the photonics layer, and both layers are processed as one in an efficient manner that avoids etching non-uniformities associated with conventional techniques. Note that in other embodiments, two masks could be used to define the electronics (e.g., CMOS) and photonics (e.g., channel and ridge waveguides) separately. Further note that a resist mask could be used over the step region if so desired, but this may likely cause subsequent particle issues. Other such variations will be apparent in light of this disclosure.

Figure 6:
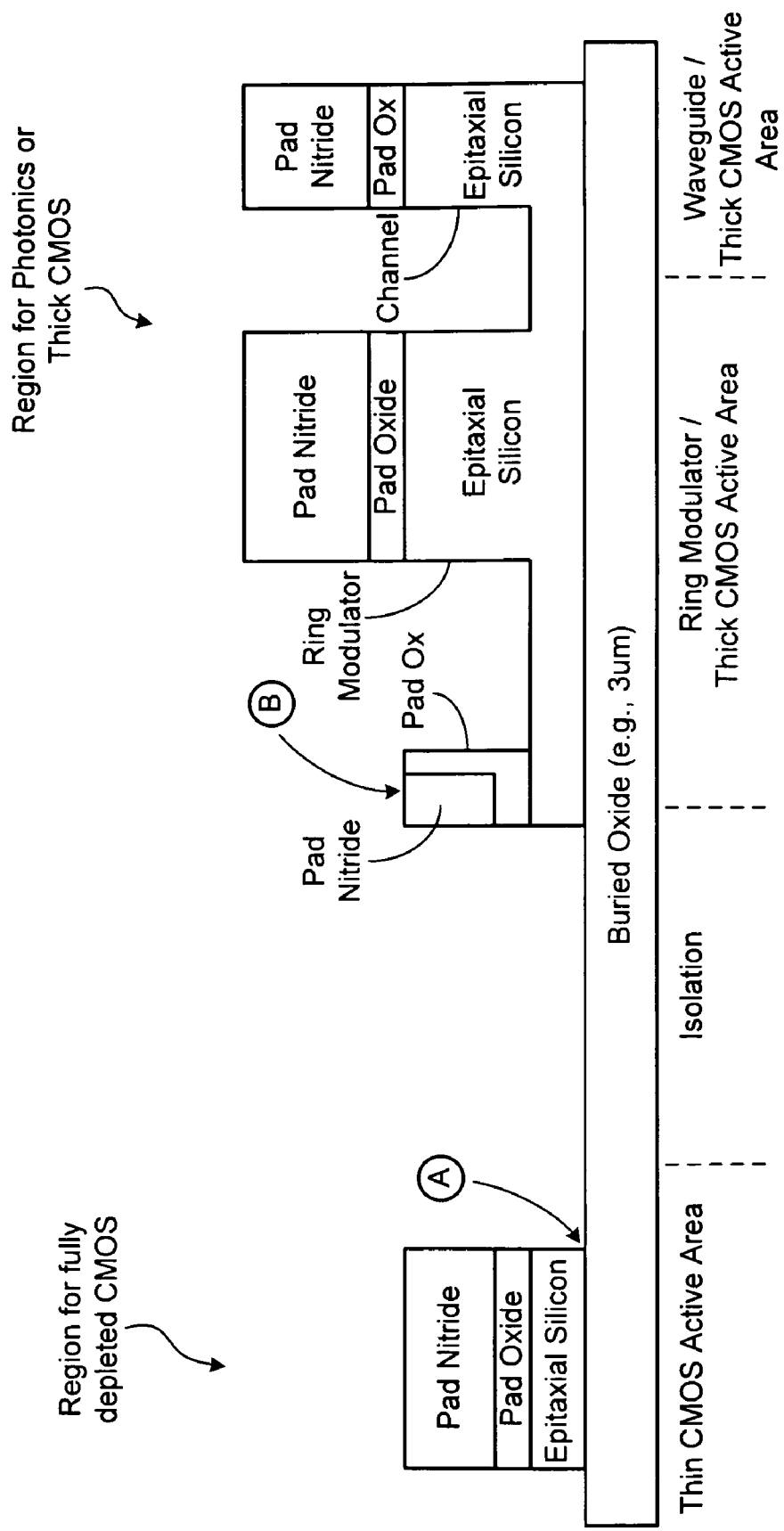

The method continues as shown in FIG. 6, wherein an initial etch is performed on the patterned hardmask to remove unmasked pad nitride and pad oxide layers, as well as portions of the epitaxial silicon layer. The amount removed of the epitaxial silicon layer depends on the region being etched. In more detail, this initial etch is a partial etch of the silicon region for photonics and thick CMOS, and leaves a prescribed amount of silicon on top of the buried oxide, so that the remaining epitaxial silicon can be used for the slab region of forthcoming modulators. As can be seen, the hardmask remains on top of the waveguide structures (which in this example embodiment happen to include a channel waveguide, and a ridge waveguide included in the ring modulator), and acts as an etch mask again during subsequent etching steps (e.g., waveguide slab mask etch). In contrast, this initial etch is a full etch of the thinner silicon region for fully depleted CMOS, where the etch of that region reaches the buried oxide layer. At point A shown in FIG. 6, note that there may be silicon undercut due to relatively long over etch. In addition, at point B, note that there may be an nitride/oxide rail at the transition point (step region), depending on etch selectivity. Once this initial etch of both the thin region (full etch) and thick region (partial etch) is completed, the resist is then stripped.

Figure 7:
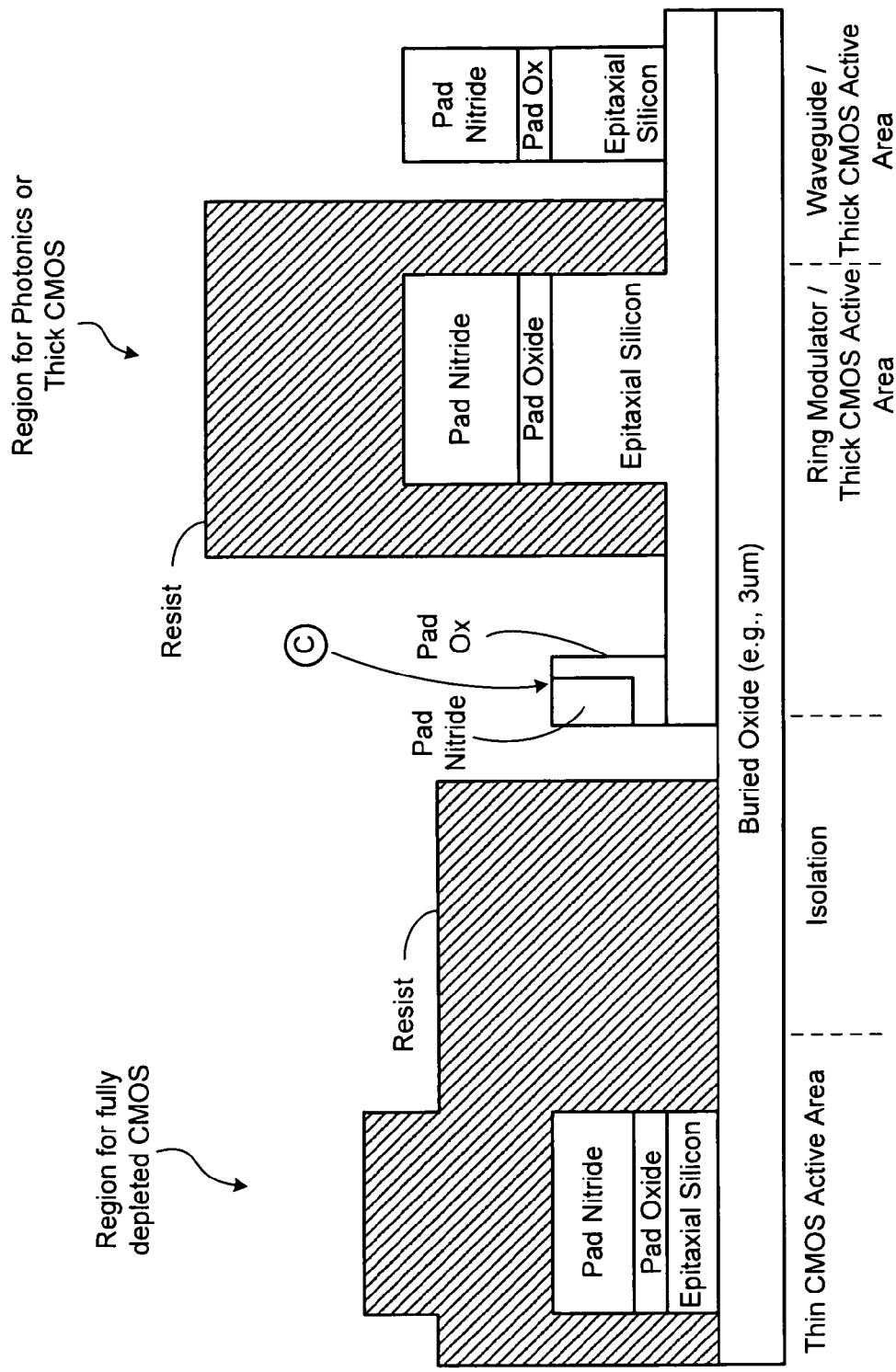
Figure 8:
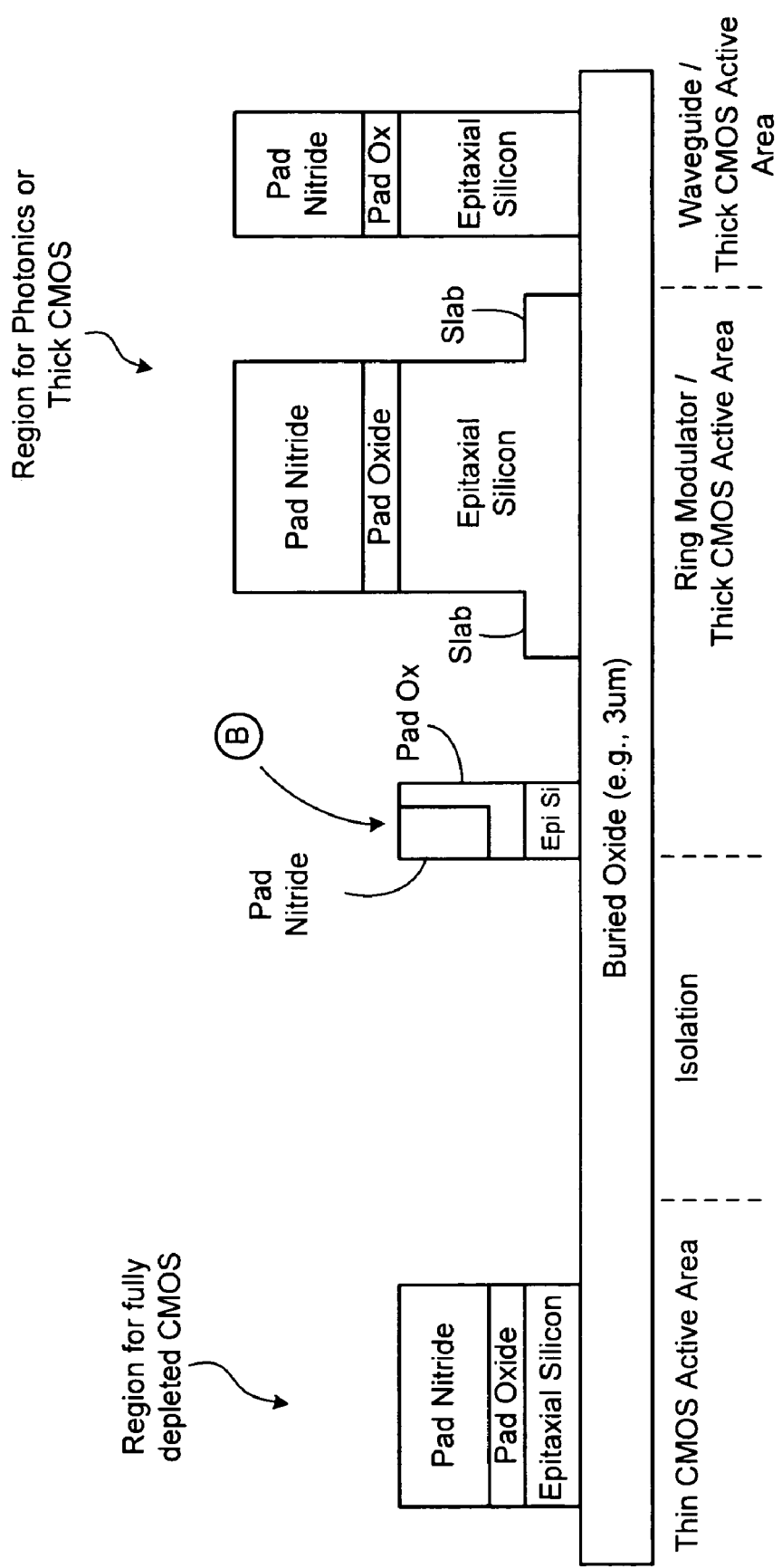

The method continues as shown in FIG. 7, where the region for photonics (or thick CMOS) is patterned to have slabs (for the ring modulator), and body contacts (for partially depleted CMOS). The resist is deposited as shown. Note that point C can also be protected with resist, or point C can be left exposed for more nitride/oxide/silicon etching if necessary. The method continues as shown in FIG. 8, where the second part of the initial etch (discussed with reference to FIG. 6) is performed to completely pattern the epitaxial silicon in the region for photonic and thick CMOS. The resist is then stripped. Note the resulting slab portions of the ring modulator. Again, at point B there may be an nitride/oxide rail at the transition point (step region), depending on etch selectivity. Standard photolithography (including suitable resist materials) can be used for the slab patterning and etching depicted in FIGS. 7 and 8.

Figure 9:
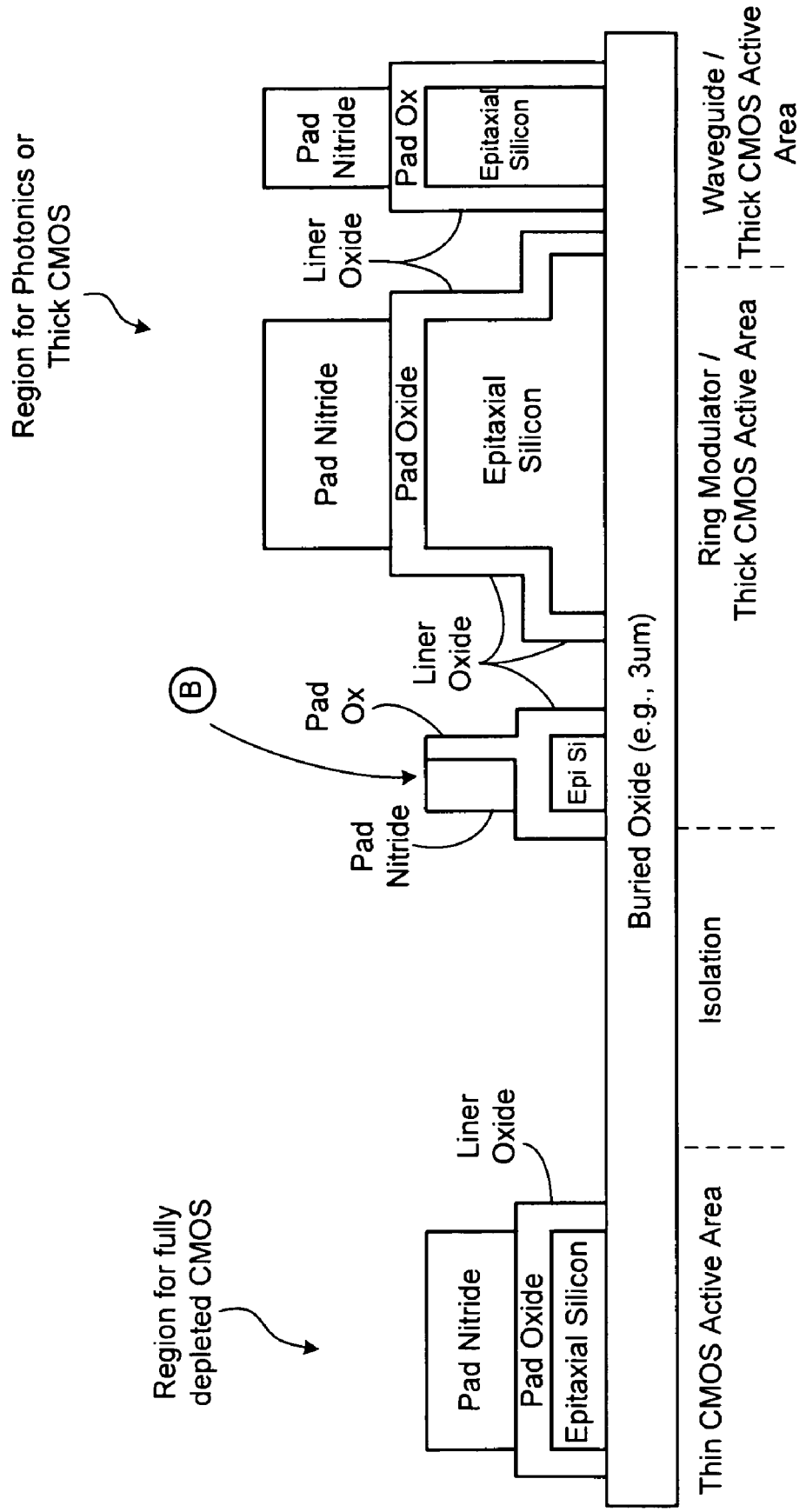

The method continues as shown in FIG. 9, where a wafer clean (e.g., Huang clean) is performed. Alternatively, this clean step may be replaced with a resist mask and hydrofluoric acid dip to undercut the pad oxide in CMOS regions. Undercutting the pad oxide leads to increased rounding (larger radius curve) at the top corners of active areas, which can be seen after subsequent oxidations. Typically for CMOS, the increased rounding is desired. A resist mask may be used to block the hydrofluoric acid exposure to photonic devices, if desired. Then, liner oxidation is carried out so that the remaining epitaxial silicon is provided with an oxide layer as shown. Liner oxidation minimizes dry etch damage on the top and sides of CMOS active areas and the sides of the waveguides. The liner oxide can be, for example, the same as the pad oxide and/or buried oxide. In addition, any desired slab implants (e.g. for ring modulator) can be completed using a photolithography (e.g., resist and etch), implant, and resist strip sequence. Again, at point B, there may be a nitride/oxide rail at the transition point (step region proximate the isolation region), depending on etch selectivity.

Figure 10:
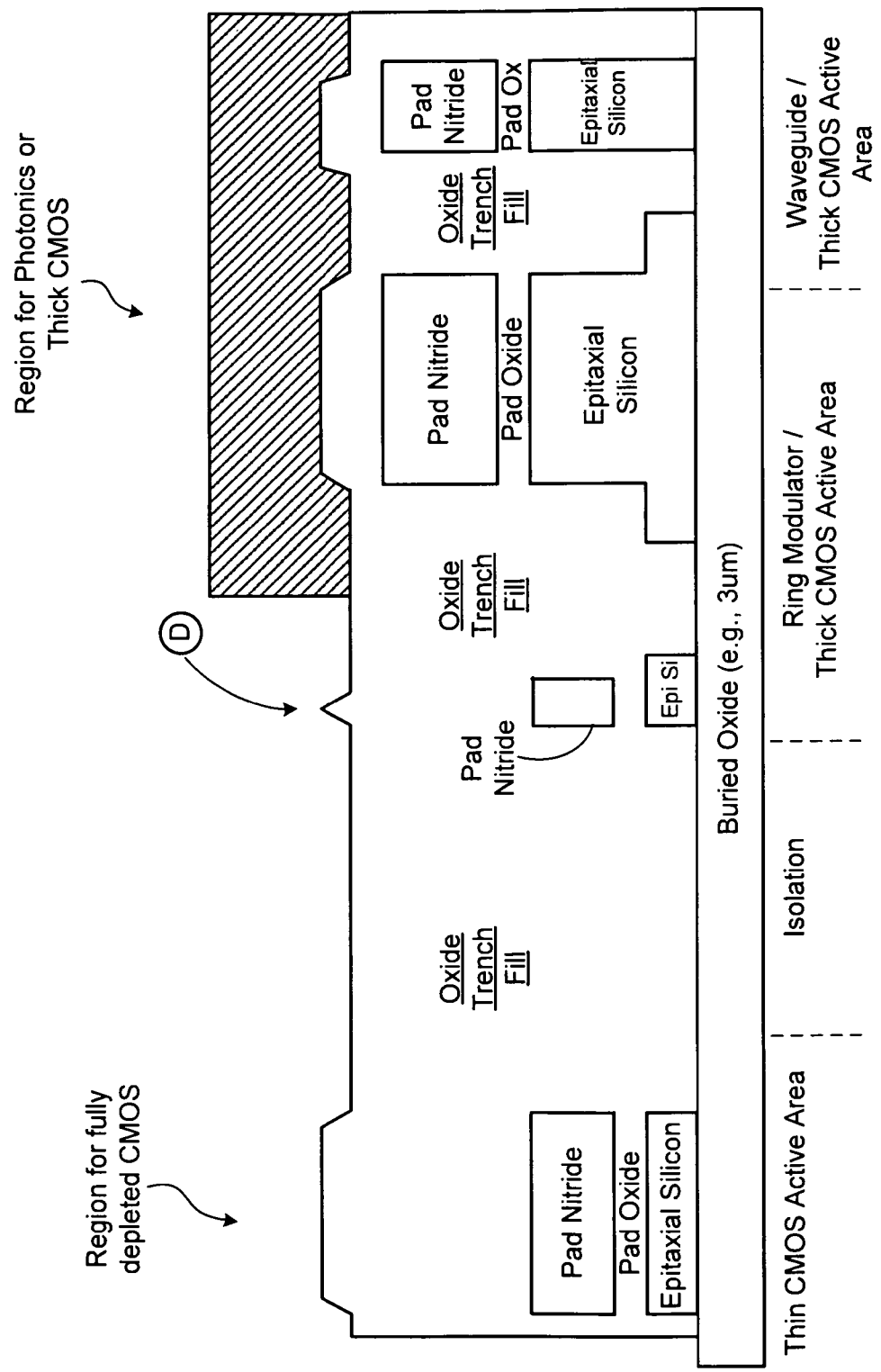

The method continues as shown in FIG. 10, where an oxide fill process is performed (i.e., the shallow trench isolation regions are filled). The oxide used for the fill can be, for example, the same as the pad oxide and/or buried oxide. In one particular embodiment, an HDP-CVD oxide is used for the oxide fill process. The patterning of the oxide thinning mask can be carried out, for example, as previously discussed with reference to FIG. 1, using standard photolithography techniques, thereby protecting (with resist) the region for photonics/thick CMOS and exposing the region designated fully depleted CMOS (or other circuitry/structure that requires a thinned region). Note that the dimensions of the oxide thinning mask (i.e., resist) can be varied to modify the transition region as desired. At point D, note that the transition region can be left exposed or protected with resist, depending on desired attributes of transition region.

Figure 11:
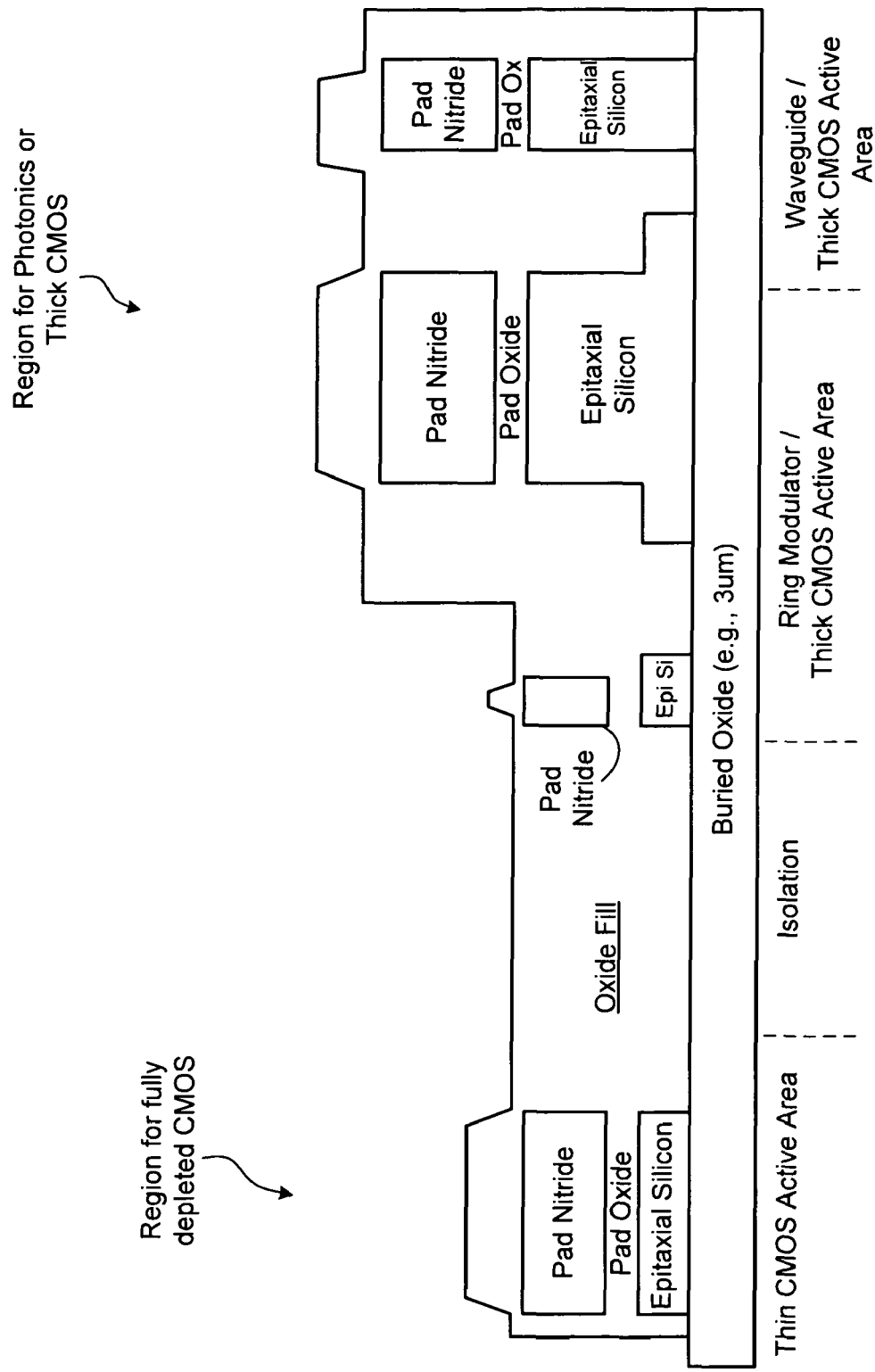

As can be seen with reference to FIG. 11, the method continues with an oxide etch (e.g., dry etch) to remove the bulk of oxide above the fully depleted CMOS active region and any unprotected isolation region. This etch process can be used to reduce polish load on the CMOS side. The method continues with stripping the resist. In other embodiments, note that the oxide etch could be eliminated by substituting a selective CMP process. In such case, a CMP dish-out process may be used to thin the oxide in the fully depleted CMOS regions. Whether etching or polishing is used depends on factors such as desired polish load or etch load, CMP and/or dish-out capability, desired processing time, etc.

Figure 12:
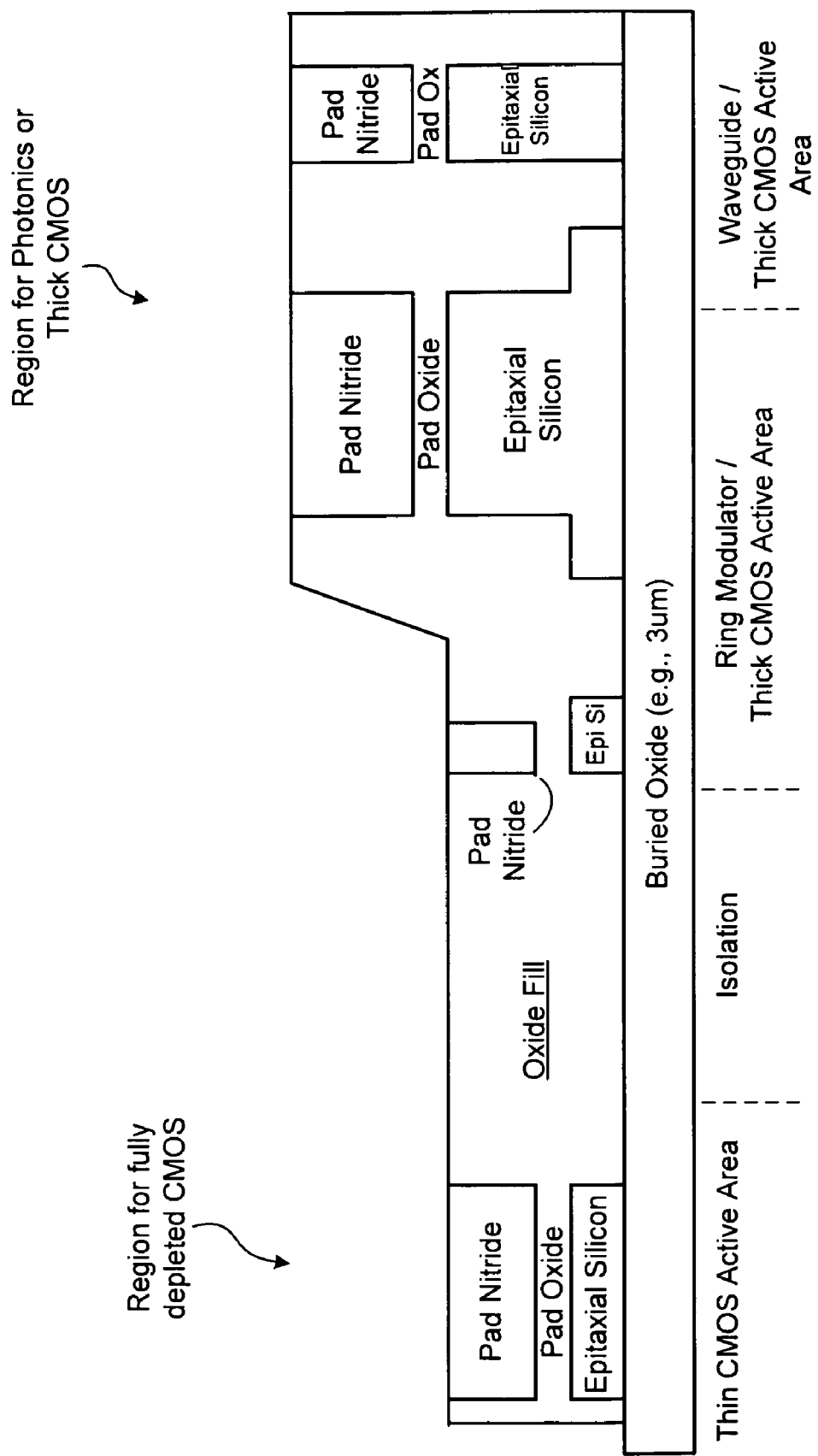
Figure 13:
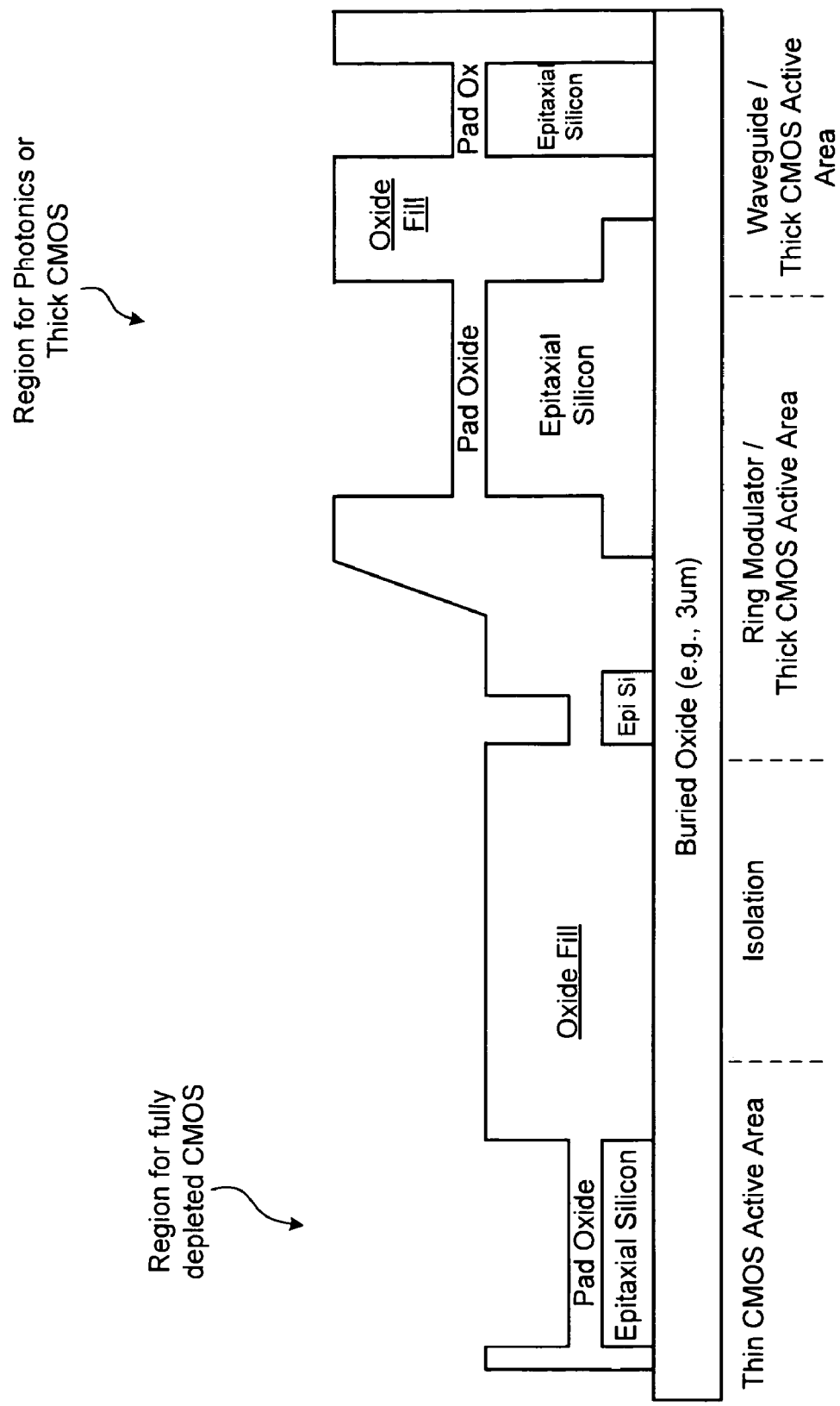

As can be seen with reference to FIG. 12, the method continues with a chemical mechanical polish (CMP) process, so as to polish all oxide down to the underlying pad nitride. Note the dish-out technique discussed in the previous section actually polishes down to the pad nitride, so the methodology can be implemented with either dry etch+CMP or simply CMP with intentional dishing. The pad nitride is resistant to the CMP action, and can therefore be used as a polish stop. The method continues as shown in FIG. 13, with removing the remaining pad nitride using, for example, a hot phosphoric dip or other suitable nitride removal scheme. As can be seen with reference to FIG. 14, the method may continue with integration into standard CMOS processing, which may include, for example, sacrificial oxide growth, body implants, gate oxide (dielectric) growth, polysilicon gate deposition and patterning, dielectric spacer deposition and etch back, and source/drain implants. Thus, and in accordance with one example embodiment, and starting at the pad nitride strip, standard CMOS processing may be used to form fully and partially depleted CMOS FETs.

Multi-thickness Semiconductor

Figure 14:
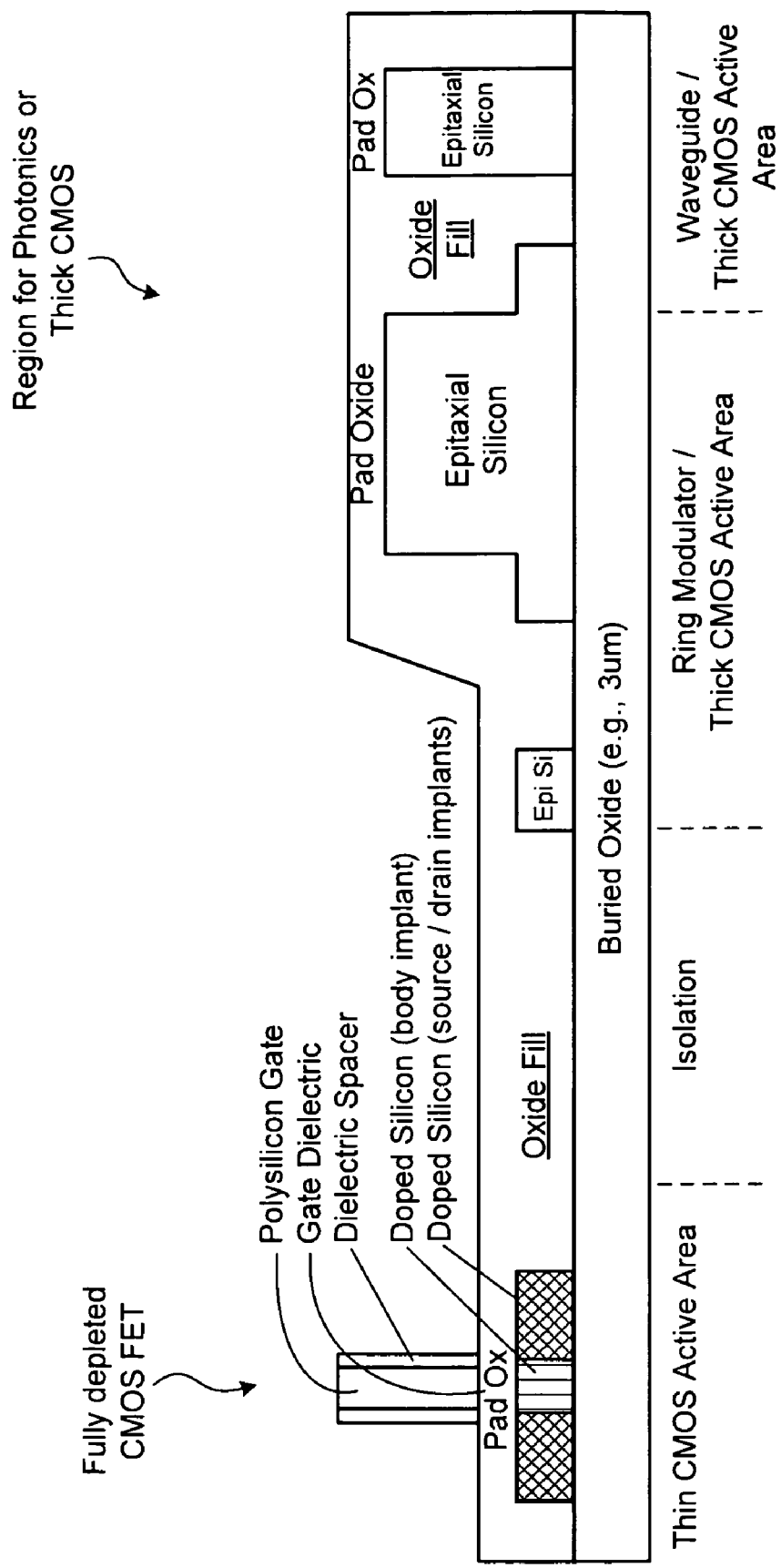

FIG. 14 shows one example of a multi-thickness semiconductor configured in accordance with an embodiment of the present invention. As can be seen, the semiconductor includes a fully depleted FET (left side of figure in the region for fully depleted CMOS), where the thinned silicon structure is used as the active area of a fully depleted FET. Both N and P-channel FETs may be made. The transistors are made by completing the required body implants into the thinned silicon region, forming a gate dielectric, depositing and patterning a gate conductor material, and completing the required source/drain implants. Additionally, spacers may be used to offset any implants as desired. Similar processing may be used to form partially depleted devices, if so desired. For instance, the channel and ridge waveguide configurations at the right of the semiconductor device of FIG. 14 can be replaced with partially depleted CMOS FETs, thereby providing a multi-thickness semiconductor having both fully and partially depleted devices.

The difference between fully and partially depleted devices is that for fully depleted devices, the silicon active regions are so thin that the source/drain doped regions encompass the full silicon thickness, whereas for partially depleted devices the silicon active regions are sufficiently thick that the source/drain doped regions do not extend to the bottom of the silicon active region. Thus, fully depleted devices only have lateral source/drain p-n junctions, whereas partially depleted devices also have vertical p-n junctions at the bottom of the source/drain regions. Partially depleted FETs may be produced by starting with silicon blocks built in the same way as the channel waveguides as discussed herein, as well as the previously incorporated U.S. application Ser. No. 12/201, 807.

Thus, the techniques described herein can be used to integrate, for example, channel waveguides, ridge waveguides, partially depleted CMOS FETS, and fully depleted CMOS FETs. As will be appreciated in light of this disclosure, the process may also encompass integration with other photonic and electronic devices, such as ring modulators and photo detectors. Likewise, semiconductor materials other than silicon can be used, such as germanium, gallium arsenide, etc.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A semiconductor device, comprising:
   a semiconductor wafer substrate defining a thin region and a thick region;
   one or more photonic devices formed in the thick region; and
   one or more fully depleted electronic devices formed in the thin region.

2. The device of claim 1 further comprising:
   an isolation area formed between the thin region and the thick region.

3. The device of claim 1 wherein the substrate has a silicon-on-insulator (SOI) configuration having epitaxial silicon on a thick buried oxide, and each of the one or more fully depleted electronic devices has an epitaxial silicon thickness that is thinner than the epitaxial silicon thickness for each of the one or more photonic devices.

4. The semiconductor device of claim 1 wherein the thick region further includes one or more partially depleted electronic devices.

5. The semiconductor device of claim 4 wherein the one or more fully depleted electronic devices only have lateral p-n junctions, and the one or more partially depleted devices have both lateral and vertical p-n junctions.

6. The semiconductor device of claim 4 wherein the one or more partially depleted electronic devices includes at least one CMOS transistor.

7. The semiconductor device of claim 1 wherein the one or more photonic devices includes at least one ring modulator.

8. The semiconductor device of claim 1 wherein the one or more photonic devices includes at least one waveguide structure.

9. The semiconductor device of claim 8 wherein the at least one waveguide structure includes a ridge waveguide and/or a channel waveguide.

10. The semiconductor device of claim 1 wherein the one or more photonic devices includes at least one photo detector.

11. The semiconductor device of claim 1 wherein the one or more photonic devices includes at least one high index contrast waveguide.

12. The semiconductor device of claim 11 wherein the at least one high index contrast waveguide includes high index contrast silicon waveguides having channel and/or ridge type configurations.

13. The semiconductor device of claim 1 wherein the one or more fully depleted electronic devices includes at least one CMOS transistor.

14. A semiconductor device, comprising:
   a semiconductor wafer substrate defining a thin region and a thick region, wherein the substrate includes a silicon-on-insulator (SOI) configuration having epitaxial silicon on a thick buried oxide;
   one or more photonic devices formed in the thick region;
   one or more fully depleted CMOS devices formed in the thin region; and
   an isolation area formed between the thin region and the thick region;
   wherein each of the one or more fully depleted CMOS devices has an epitaxial silicon thickness that is thinner than the epitaxial silicon thickness for each of the one or more photonic devices.

15. The semiconductor device of claim 14 wherein the thick region further includes one or more partially depleted CMOS devices.

16. The semiconductor device of claim 15 wherein the one or more fully depleted CMOS devices only have lateral p-n junctions, and the one or more partially depleted CMOS devices have both lateral and vertical p-n junctions.

17. The semiconductor device of claim 14 wherein the one or more photonic devices includes at least one ring modulator and/or a photo detector.

18. The semiconductor device of claim 14 wherein the one or more photonic devices includes a ridge waveguide and/or a channel waveguide.

19. The semiconductor device of claim 14 wherein the one or more photonic devices includes at least one high index contrast waveguide.

20. The semiconductor device of claim 19 wherein the at least one high index contrast waveguide includes high index contrast silicon waveguides having channel and/or ridge type configurations.

21. A semiconductor device, comprising:
   a semiconductor wafer substrate defining a thin region and a thick region;
   one or more photonic devices formed in the thick region, wherein the one or more photonic devices includes at least one of a ridge waveguide, a channel waveguide, a high index contrast waveguide, and a ring modulator;
   one or more fully depleted CMOS devices formed in the thin region; and
   an isolation area formed between the thin region and the thick region.

* * * * *